(12) United States Patent
Iucolano et al.

(10) Patent No.: US 11,222,969 B2
(45) Date of Patent: Jan. 11, 2022

(54) NORMALLY-OFF TRANSISTOR WITH REDUCED ON-STATE RESISTANCE AND MANUFACTURING METHOD

(71) Applicant: STMICROELECTRONICS S.R.L., Agrate Brianza (IT)

(72) Inventors: Ferdinando Iucolano, Gravina di Catania (IT); Alfonso Patti, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/808,311

(22) Filed: Mar. 3, 2020

(65) Prior Publication Data

US 2020/0203522 A1    Jun. 25, 2020

Related U.S. Application Data

(62) Division of application No. 15/159,127, filed on May 19, 2016, now abandoned.

(30) Foreign Application Priority Data

Nov. 24, 2015    (IT) .................. 102015000076151

(51) Int. Cl.
*H01L 29/66*        (2006.01)
*H01L 29/778*       (2006.01)
(Continued)

(52) U.S. Cl.
CPC ...... *H01L 29/7787* (2013.01); *H01L 21/0254* (2013.01); *H01L 29/1045* (2013.01);
(Continued)

(58) Field of Classification Search
CPC ............. H01L 21/0254; H01L 29/1045; H01L 29/2003; H01L 29/205; H01L 29/41766;
(Continued)

(56) References Cited

U.S. PATENT DOCUMENTS 6,580,101 B2    6/2003 Yoshida
7,038,252 B2    5/2006 Saito et al.
(Continued)

FOREIGN PATENT DOCUMENTS

WO    2015/175915 A1    11/2015

OTHER PUBLICATIONS

Ben-Yaacov et al., "AlGaN/GaN current aperture vertical electron transistors with regrown channels," Journal of Applied Physics 95(4):2073-2078, 2004.
(Continued)

*Primary Examiner* — Jay C Kim
(74) *Attorney, Agent, or Firm* — Seed Intellectual Property Law Group LLP

(57) ABSTRACT

A normally-off electronic device, comprising: a semiconductor body including a heterostructure that extends over a buffer layer; a recessed-gate electrode, extending in a direction orthogonal to the plane; a first working electrode and a second working electrode at respective sides of the gate electrode; and an active area housing, in the on state, a conductive path for a flow of electric current between the first and second working electrodes. A resistive region extends at least in part in the active area that is in the buffer layer and is designed to inhibit the flow of current between the first and second working electrodes when the device is in the off state. The gate electrode extends in the semiconductor body to a depth at least equal to the maximum depth reached by the resistive region.

20 Claims, 6 Drawing Sheets

(51) Int. Cl.
*H01L 29/423* (2006.01)
*H01L 29/20* (2006.01)
*H01L 29/10* (2006.01)
*H01L 21/02* (2006.01)
*H01L 29/205* (2006.01)
*H01L 29/417* (2006.01)

(52) U.S. Cl.
CPC ........ *H01L 29/2003* (2013.01); *H01L 29/205* (2013.01); *H01L 29/41766* (2013.01); *H01L 29/4236* (2013.01); *H01L 29/66462* (2013.01); *H01L 29/7786* (2013.01)

(58) Field of Classification Search
CPC ........... H01L 29/4236; H01L 29/66462; H01L 29/7786; H01L 29/7787
See application file for complete search history.

(56) References Cited

U.S. PATENT DOCUMENTS

| | | | |
|---|---|---|---|
| 7,180,103 B2 | 2/2007 | Bude et al. | |
| 7,211,839 B2 | 5/2007 | Kachi et al. | |
| 7,449,762 B1 | 11/2008 | Singh | |
| 7,638,818 B2 | 12/2009 | Wu et al. | |
| 7,812,371 B2 | 10/2010 | Kaya et al. | |
| 7,838,904 B2* | 11/2010 | Nakazawa | H01L 29/1029 257/194 |
| 7,838,907 B2 | 11/2010 | Shiraishi | |
| 7,943,496 B2 | 5/2011 | Nomura et al. | |
| 7,985,986 B2 | 7/2011 | Heikman et al. | |
| 8,035,128 B2 | 10/2011 | Ikeda et al. | |
| 8,044,434 B2 | 10/2011 | Ohta et al. | |
| 8,072,002 B2 | 12/2011 | Niyama et al. | |
| 8,093,626 B2 | 1/2012 | Niiyama et al. | |
| 8,093,627 B2 | 1/2012 | Otake et al. | |
| 8,114,717 B2 | 2/2012 | Palacios et al. | |
| 8,134,180 B2 | 3/2012 | Otake et al. | |
| 8,134,181 B2 | 3/2012 | Sato et al. | |
| 8,269,253 B2 | 9/2012 | Birkhahn | |
| 8,309,988 B2 | 11/2012 | Niiyama et al. | |
| 8,314,447 B2 | 11/2012 | Hirler et al. | |
| 8,330,167 B2 | 12/2012 | Takehiko et al. | |
| 8,330,187 B2 | 12/2012 | Takehiko et al. | |
| 8,357,602 B2 | 1/2013 | Kanamura et al. | |
| 8,368,121 B2 | 2/2013 | Xin et al. | |
| 8,390,030 B2 | 3/2013 | Saito et al. | |
| 8,421,148 B2 | 4/2013 | Harris et al. | |
| 8,426,260 B2 | 4/2013 | Miyajima et al. | |
| 8,426,895 B2 | 4/2013 | Okamoto et al. | |
| 8,519,438 B2 | 8/2013 | Mishra et al. | |
| 8,653,559 B2 | 2/2014 | Corrion et al. | |
| 8,659,055 B2 | 2/2014 | Okamoto et al. | |
| 8,664,696 B2* | 3/2014 | Yoshioka | H01L 21/28264 257/194 |
| 8,669,591 B2 | 3/2014 | Marino et al. | |
| 8,723,228 B1 | 5/2014 | Oh | |
| 8,759,876 B2 | 6/2014 | Lu et al. | |
| 8,785,973 B2* | 7/2014 | Vashchenko | H01L 27/0248 257/175 |
| 8,866,157 B2* | 10/2014 | Nakamura | H01L 29/78 257/77 |
| 8,883,581 B2 | 11/2014 | Ohki | |
| 8,912,570 B2 | 12/2014 | Chiang et al. | |
| 8,963,203 B2* | 2/2015 | Kuraguchi | H01L 29/205 257/183 |
| 8,987,780 B2* | 3/2015 | Zhang | H01L 29/66431 257/183 |
| 9,006,791 B2 | 4/2015 | Kub et al. | |
| 9,024,356 B2 | 5/2015 | Curatola et al. | |
| 9,024,357 B2 | 5/2015 | Puglisi et al. | |
| 9,076,850 B2 | 7/2015 | Hwang et al. | |
| 9,099,341 B2 | 8/2015 | Saeki | |
| 9,111,851 B2* | 8/2015 | Kuo | H01L 29/2003 |
| 9,111,905 B2* | 8/2015 | Yao | H01L 29/7786 |
| 9,123,791 B2 | 9/2015 | Curatola | |
| 9,166,048 B2 | 10/2015 | Simin et al. | |
| 9,184,275 B2 | 11/2015 | Mishra et al. | |
| 9,230,799 B2 | 1/2016 | Teramoto et al. | |
| 9,269,577 B2 | 2/2016 | Iwami | |
| 9,269,782 B2* | 2/2016 | Kanamura | H01L 29/2003 |
| 9,269,790 B2* | 2/2016 | Lee | H01L 29/7787 |
| 9,299,821 B2 | 3/2016 | Shealy et al. | |
| 9,306,049 B2 | 4/2016 | Lee et al. | |
| 9,306,051 B2* | 4/2016 | Miura | H01L 29/7787 |
| 9,337,332 B2 | 5/2016 | Chu et al. | |
| 9,349,807 B2 | 5/2016 | Kuraguchi | |
| 9,391,186 B2* | 7/2016 | Lee | H01L 29/7787 |
| 9,425,268 B2* | 8/2016 | Minoura | H01L 29/40114 |
| 9,431,527 B1 | 8/2016 | Luo et al. | |
| 9,443,950 B2 | 9/2016 | Oka et al. | |
| 9,490,357 B2 | 11/2016 | Khalil et al. | |
| 9,496,380 B2 | 11/2016 | Minoura et al. | |
| 9,536,978 B2* | 1/2017 | Nakayama | H01L 29/66462 |
| 9,559,183 B2 | 1/2017 | Inoue et al. | |
| 9,601,608 B2* | 3/2017 | Tsai | H01L 29/66462 |
| 9,812,532 B1 | 11/2017 | Chu et al. | |
| 9,831,331 B2 | 11/2017 | Morancho et al. | |
| 9,837,488 B2* | 12/2017 | Saito | H01L 29/0847 |
| 9,842,923 B2* | 12/2017 | Banerjee | H01L 29/7786 |
| 9,899,226 B2 | 2/2018 | Ahn et al. | |
| 9,917,080 B2 | 3/2018 | Ritenour | |
| 9,941,384 B2* | 4/2018 | You | H01L 29/7786 |
| 10,109,727 B2* | 10/2018 | Oyama | H01L 29/778 |
| 2002/0175389 A1 | 11/2002 | Shibata et al. | |
| 2005/0242364 A1 | 11/2005 | Moustakas et al. | |
| 2006/0281238 A1 | 12/2006 | Harris et al. | |
| 2007/0120141 A1 | 5/2007 | Moustakas et al. | |
| 2007/0249119 A1 | 10/2007 | Saito | |
| 2010/0078688 A1 | 4/2010 | Otake et al. | |
| 2010/0117094 A1 | 5/2010 | Nishikawa et al. | |
| 2011/0210377 A1* | 9/2011 | Haeberlen | H01L 29/205 257/194 |
| 2012/0193637 A1 | 8/2012 | Kalnitsky et al. | |
| 2013/0056746 A1 | 3/2013 | Joshin | |
| 2013/0095581 A1 | 4/2013 | Lee et al. | |
| 2013/0105810 A1 | 5/2013 | Nishimori et al. | |
| 2013/0240900 A1 | 9/2013 | Yaegashi et al. | |
| 2013/0306980 A1 | 11/2013 | Niiyama et al. | |
| 2014/0091364 A1 | 4/2014 | Imanishi et al. | |
| 2014/0253241 A1* | 9/2014 | Lee | H01L 29/045 330/277 |
| 2015/0041820 A1 | 2/2015 | Renaud | |
| 2015/0060943 A1 | 3/2015 | Motonobu et al. | |
| 2015/0076508 A1 | 3/2015 | Saito et al. | |
| 2015/0084104 A1 | 3/2015 | Ando | |
| 2015/0194309 A1 | 7/2015 | Motoki et al. | |
| 2015/0194512 A1 | 7/2015 | Ohki et al. | |
| 2015/0255547 A1 | 9/2015 | Yuan et al. | |
| 2015/0303655 A1 | 10/2015 | Han et al. | |
| 2015/0380461 A1 | 12/2015 | Robin et al. | |
| 2016/0240645 A1 | 8/2016 | Prechtl et al. | |
| 2017/0000625 A1 | 3/2017 | You et al. | |
| 2017/0125574 A1 | 5/2017 | Chowdhury et al. | |

OTHER PUBLICATIONS

Cai, Y. et al., "Control of Threshold Voltage of AlGaN/GaN HEMTs by Fluoride-Based Plasma Treatment: From Depletion Mode to Enhancement Mode," IEEE Transactions on Electron Devices 53(9):2207-2215, Sep. 2006.

Chowdhury et al., "Current status and scope of gallium nitride-based vertical transistors for high-power electronics application," Semicond. Sci. Technol, 28:8 pages, 2013.

Cooke, "Power, speed and other highlights at IEDM," Semiconductor Today 5(10):98-102, 2011.

Dargahi et al., "On the Suitability of Gallium-Nitride (GaN) Based Automotive Power Electronics," IEEE Vehicle Power and Propulsion Conference, Piscataway, New Jersey, 2010, 6 pages.

Ghaffari et al., "Operational improvement of AlGa N/Ga N H EMT on SiC substrate with the amended depletion region," Physica E 74:303-309, 2015.

(56) References Cited

OTHER PUBLICATIONS

Huang et al., "Au-Free Normally-Off AlGaN/GaN-on-Si MIS-HEMTs Using Combined Partially Recessed and Fluorinated Trap-Charge Gate Structures," IEEE Electron Device Letters 35(5):569-571, 2014.

Huang, X. et al., "Evaluation and Application of 600V GaN HEMT in Cascode Structure," Twenty-Eighth Annual IEEE Applied Power Electronics Conference and Exposition (APEC), pp. 1279-1286, Mar. 17-21, 2013.

Im, K-S. et al., "Recessed-Gate Normally-Off GaN MOSFET Technologies," International Journal of High Speed Electronics and Systems 21(1):1250007-1-1250007-20, 2012.

Kim, D-S. et al., "Normally-off operation of $Al_2O_3$/GaN MOSFET based on AlGaN/GaN heterostructure with p-GaN buffer layer," $22^{nd}$ International Symposium on Power Semiconductor Devices & IC's (ISPSD), 3 pgs., Jun. 6-10, 2010.

Kim, K-W. et al., "Effects of TMAH Treatment on Device Performance of Normally Off $Al_2O_3$/GaN MOSFET," IEEE Electron Device Letters 32(10):1376-1378, Oct. 2011.

Lanford W.B. et al., "Recessed-gate enhancement-mode GaN HEMT with high threshold voltage," Electronics Letters 41(7), 2 pgs., Mar. 31, 2005.

Lim, W. et al., "Normally-Off Operation of Recessed-Gate AlGaN/GaN HFETs for High Power Applications," Elecrochemical and Solid-State Letters 14(5):H205-H207, 2011.

Lin et al., "An alternative passivation approach for AlGaN/GaN HEMTs," Solid State Electronics 54:552-556, 2010.

Nepal, N. et al., "Assessment of GaN Surface Pretreatment for Atomic Layer Deposited High-k Dielectrics," Applied Physics Express, vol. 4, pp. 055802-1-055802-3, 2011.

Nie et al., "1.5-kV and 2.2-mΩ-$cm^2$ Vertical GaN Transistors on Bulk-GaN Substrates," IEEE Electron Device Letters 35(9):939-941, 2014.

Ohmaki, Y. et al., "Enhancement-Mode AlGaN/AlN/GaN High Electron Mobility Transistor with Low On-State Resistance and High Breakdown Voltage," The Japan Society of Applied Physics 45(44):L1168-L1170, 2006.

Saito, W. et al., "Recessed-Gate Structure Approach Toward Normally Off High-Voltage AlGaN/GaN HEMT for Power Electronics Applications," IEEE Transactions on Electron Devices 53(2): 356-362, Feb. 2006.

Shibata et al., "1.7 kV 11.O mΩ$cm^2$ Normally-off Vertical GaN Transistor on GaN substrate with Regrown p-GaN/ AlGaN/GaN Semipolar Gate Structure," IEEE International Electron Devices Meeting (IEDM), San Francisco, California, 2016, 4 pages.

Singisetti et al., "High-performance N-polar GaN enhancement-mode device technology," Semicond. Sci. Technol, 28: 2013, 13 pages.

Tajima, M. et al., "Effects of Surface Oxidation of AlGaN on DC Characteristics of AlGaN/GaN High-Electron-Mobility Transistors," Japanese Journal of Applied Physics, vol. 48, pp. 020203-1-020203-3, 2009.

Uemoto, Y. et al., "Gate Injection Transistor (GIT)—A Normally-Off AlGaN/GaN Power Transistor Using Conductivity Modulation," IEEE Transactions on Electron Devices 54(12):3393-3399, Dec. 2007.

Wakejima et al., "Normally off AlGaN/GaN HEMT on Si substrate with selectively dry-etched recessed gate and polarization-charge-compensation σ-doped GaN cap layer," Applied Physics Express 8: 2015, 4 pages.

Yeluri et al., "Design, fabrication, and performance analysis of GaN vertical electron transistors with a buried pin junction," Applied Physics Letters 106: 2015, 5 pages.

Zhang et al., "Electrothermal Simulation and Thermal Performance Study of GaN Vertical and Lateral Power Transistors," IEEE Transactions on Electronic Devices, 60(7):2224-2230, 2013.

Zhang, "Simulation and Fabrication of GaN-Based Vertical and Lateral Normally-off Power Transistors," Master's Thesis, Massachusetts Institute of Technology, Cambridge, Massachusetts, 2013, 98 pages.

* cited by examiner

NORMALLY-OFF TRANSISTOR WITH REDUCED ON-STATE RESISTANCE AND MANUFACTURING METHOD

BACKGROUND

Technical Field

The present disclosure relates to a normally-off transistor with reduced ON-state resistance and to a method for manufacturing the transistor.

Description of the Related Art

Known to the art are high-electron-mobility transistors (HEMTs) with a heterostructure, made in particular of gallium nitride (GaN) and gallium and aluminum nitride (AlGaN). For instance, HEMT devices are appreciated for use as power switches thanks to their high breakdown threshold. Furthermore, the high current density in the conductive channel of the HEMT enables a low ON-state resistance ($R_{ON}$) of the conductive channel to be obtained.

To favor use of HEMTs in high-power applications, HEMTs with normally-off channel have been introduced. HEMT devices with recessed-gate terminal have proven particularly advantageous for use as transistors with normally-off channel. A device of this type is, for example, known from Wantae Lim et al., "Normally-Off Operation of Recessed-Gate AlGaN/GaN HFETs for High Power Applications", Electrochem. Solid-State Lett. 2011, volume 14, issue 5, H205-H207.

This HEMT has a gate trench that extends in depth in the heterostructure to the GaN layer. Extending in said trench is the gate metallization, which is separated from the AlGaN/GaN layers that form the heterostructure by a gate-dielectric layer. Formation of the gate trench is obtained by known steps of chemical etching and generates morphological defectiveness of various nature, such as for example even extensive surface corrugations or in general damage generated by the etching process (such as depressions or protuberances).

The document U.S. Pat. No. 8,330,187 discloses a MOSFET with AlGaN/GaN heterojunction which has a recessed-gate terminal that extends in depth in a semiconductor body. The semiconductor body has, underneath the heterojunction, a GaN layer with a doping of a P-type, having the function of channel layer. Since the channel layer has a doping of a P-type, it makes it possible to obtain, in use, a transistor of a normally-off type with high turn-on threshold voltage. The gate terminal extends as far as the channel layer, and terminates within the channel layer itself. When, in use, the voltage applied to the gate terminal generates a charge-carrier inversion in the channel layer, a conductive channel is set up in the channel layer, which enables flow of a current between the source and drain terminals. However, the present applicant has found that the device according to U.S. Pat. No. 8,330,187 has a high ON-state resistance due to the fact that the conductive channel is formed, for the most part, within the channel layer.

BRIEF SUMMARY

At least some embodiments provide a transistor of a normally-off type that enables a good trade-off between high threshold voltage and reduced ON-state resistance for overcoming the drawbacks of the known art.

According to at least some embodiments of the present disclosure a transistor of a normally-off type includes:

a semiconductor body lying in a plane and including a buffer region and a heterostructure extending over the buffer region;

a gate recessed electrode extending in the semiconductor body at least partially through the buffer region, along a direction orthogonal to the plane;

a first working electrode and a second working electrode, which extend at respective sides of the gate electrode; and an active area which extends in the buffer region alongside and underneath the gate electrode and is configured to house, in a first operating condition in which a voltage between the gate electrode and the first working electrode is higher than a threshold voltage, a conductive path for a flow of an electric current between the first and second working electrodes.

The active area in the buffer region houses a resistive region configured to hinder, in a second operating condition in which the voltage between the gate electrode and the first working electrode is lower than the threshold voltage, the electric current flow between the first and second working electrodes. The resistive region extends at least in part in said active area, and said gate electrode extends in the semiconductor body to a depth, in said direction, equal to, or greater than, a maximum depth reached by the resistive region.

According to at least some embodiments of the present disclosure a method for manufacturing a normally-off transistor includes:

forming a recessed gate electrode in a semiconductor body extending in a plane and including a buffer region and a heterostructure, the gate electrode extending at least partially through the buffer region, along a direction orthogonal to the plane;

forming a first working electrode and a second working electrode at respective sides of the gate electrode, wherein the gate electrode, and the first and second working electrodes define an active area in the buffer region alongside and underneath the gate electrode, said active area being configured to house, in a first operating condition in which a voltage between the gate electrode and the first working electrode is higher than a threshold voltage, a conductive path for a flow of electric current between the first and second working electrodes; and forming a resistive region at least in part in the active area in said buffer region, said gate electrode extending in the semiconductor body as far as a depth, in the direction, equal to, or higher than, a maximum depth reached by the resistive region, the resistive region being configured to hinder, in a second operating condition in which the voltage between the gate electrode and the first working electrode is lower than the threshold voltage, the flow of electric current between the first and second working electrodes.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
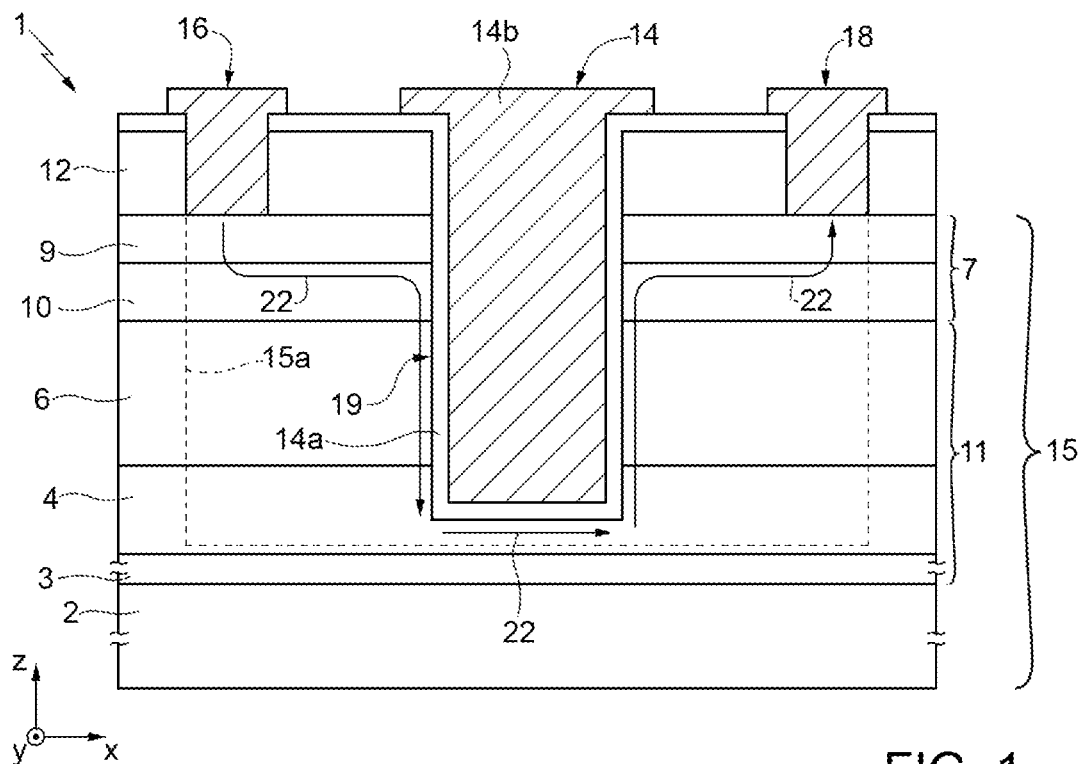
FIG. 1 shows, in lateral section, a HEMT according to one embodiment of the present disclosure.

FIG. 1 shows, in a triaxial system of orthogonal axes X, Y, Z, a HEMT device 1 of a normally-off type, based upon gallium nitride, including: a substrate 2, made, for example, of silicon, or silicon carbide (SiC), or sapphire ($Al_2O_3$); a buffer layer 11 extending over the substrate 2; and a heterojunction, or heterostructure, 7 extending over the buffer layer 11.

The buffer layer 11 comprises an electrical-conduction layer 4 and a resistive layer 6, where the electrical-conduction layer 4 is of gallium nitride (GaN) of an intrinsic type or with N-type doping and extends over the substrate 2, whereas the resistive layer 6 is of gallium nitride (GaN) with a doping of a P-type (for example, with a concentration of dopant species comprised between $10^{15}$ and $10^{20}$ ions/cm$^3$) and extends over the electrical-conduction layer 4. The buffer layer 11 further comprises, optionally, one or more additional buffer layers (or interface layers) 3 of compounds formed by elements belonging to Groups III-V of the Periodic Table including gallium, which extend between the substrate and the electrical-conduction layer 4.

The buffer layer 11 has the function of configuring the device as a normally-off device.

The one or more interface layers 3 have the function of withstanding the drain voltage when the device is off and of decreasing the density of threading dislocations.

The heterostructure 7 includes, in particular, a barrier layer 9, made for example of gallium nitride (GaN) of an intrinsic type, extending over the resistive layer 6, and a channel layer 10, in this case of aluminum gallium nitride (AlGaN), extending over the barrier layer 9.

The HEMT device 1 further comprises an insulation layer 12, of dielectric material such as silicon nitride ($Si_3N_4$) or silicon oxide ($SiO_2$), extending over a top side 7a of the heterostructure 7; and a gate region 14, extending between a source region 16 and a drain region 18.

In what follows, the substrate 2, the buffer layer 11 (and the buffer layer 3, when present), and the heterostructure 7 are referred to, as a whole, as the semiconductor body 15. The semiconductor body 15 houses an active region 15a, which forms the active part of the HEMT device 1.

The gate region 14 is separated laterally (i.e., along X) from the source region 16 and the drain region 18 by respective portions of the insulation layer 12. The gate region 14 is of a recessed type, and, according to one aspect of the present disclosure, extends in depth through the heterostructure 7, the resistive layer 6, and, in part, the electrical-conduction layer 4, terminating within the electrical-conduction layer 4. For example, considering an electrical-conduction layer 4 having a thickness, along Z, comprised between 20 nm and 10 µm, the gate region 14 extends in the electrical-conduction layer 4 for a depth greater than 0 µm and less than 10 µm, for example 0.5 µm.

Figure 2:
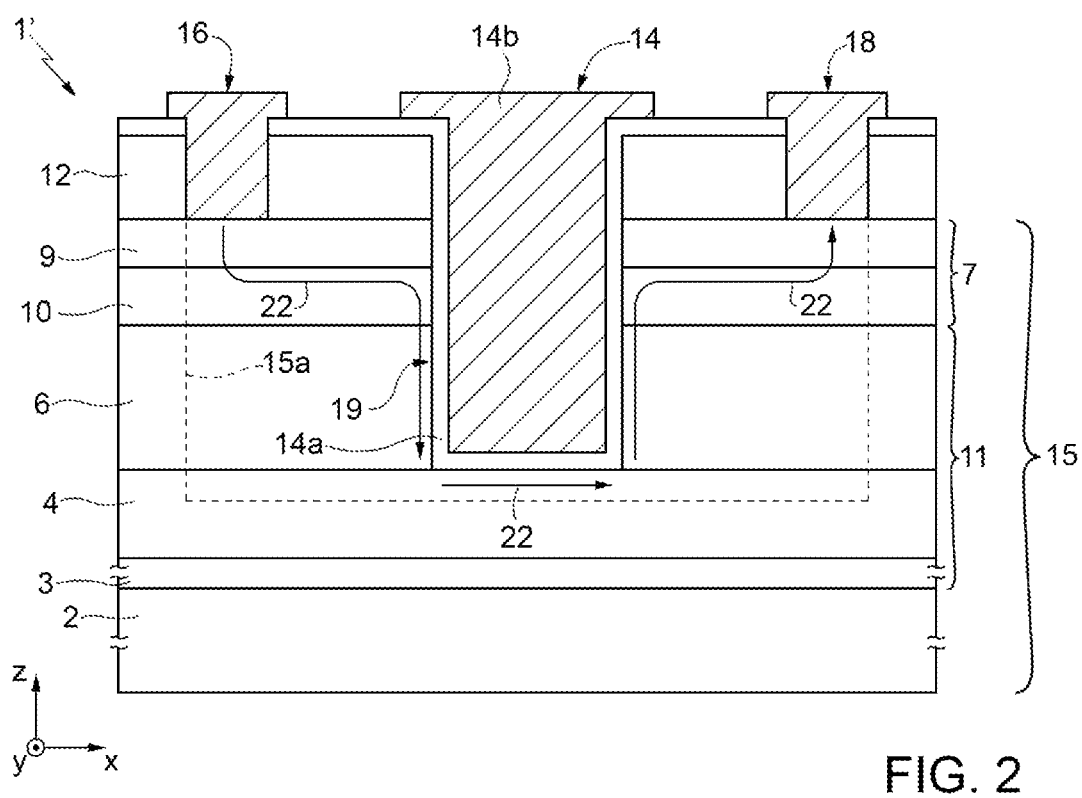
FIG. 2 shows, in lateral section, a HEMT according to a further embodiment of the present disclosure.

According to a different aspect of the present disclosure, as illustrated in FIG. 2, the gate region 14 extends in depth right through the heterostructure 7 and the resistive layer 6 and terminates at the interface between the resistive layer 6 and the electrical-conduction layer 4. The gate region 14 thus reaches the electrical-conduction layer 4, but does not penetrate therein.

Irrespective of the embodiment, the gate region 14 is formed in a trench 19 etched through part of the semiconductor body 15. The trench 19 is partially filled by a dielectric layer 11, for example silicon oxide, which forms a gate-dielectric layer 14a. The gate-dielectric layer 14a extends over the bottom and inner side walls of the trench 19. A gate metallization 14b extends in the trench 19 on the gate-dielectric layer 14a. The gate-dielectric layer 14a and the gate metallization 14b form the gate region 14 of the HEMT device 1.

According to further embodiments (not shown), the semiconductor body 15, like the active region 15a housed thereby, may comprise a single layer or a number of layers of GaN, or GaN alloys, appropriately doped or of an intrinsic type.

The source region 16 and drain region 18, of conductive material, for example metal, extend over, and in contact with, the heterostructure 7. According to a different embodiment, the source region 16 and drain region 18 may be of a recessed type, i.e., penetrate into a portion of the semiconductor body 15.

The gate region 14 extends in an area corresponding to the active region 15a.

In use, when the gate region 14 is biased with a voltage $V_G$ higher than a threshold voltage $V_{th}$, a conductive channel 22 is created (represented schematically by arrows) between the source region 16 and the drain region 18, said channel extending in the direction Z through the resistive layer 6 and in the direction X through the electrical-conduction layer 4, underneath the gate region 14. In this way, the path of the current through the resistive layer 6, of p-GaN, is minimized and the ON-state resistance, $R_{ON}$, is optimized.

Operation of the HEMT device 1' of FIG. 2 and the corresponding advantages are similar to those described with reference to the HEMT device 1 of FIG. 1.

Figure 3:
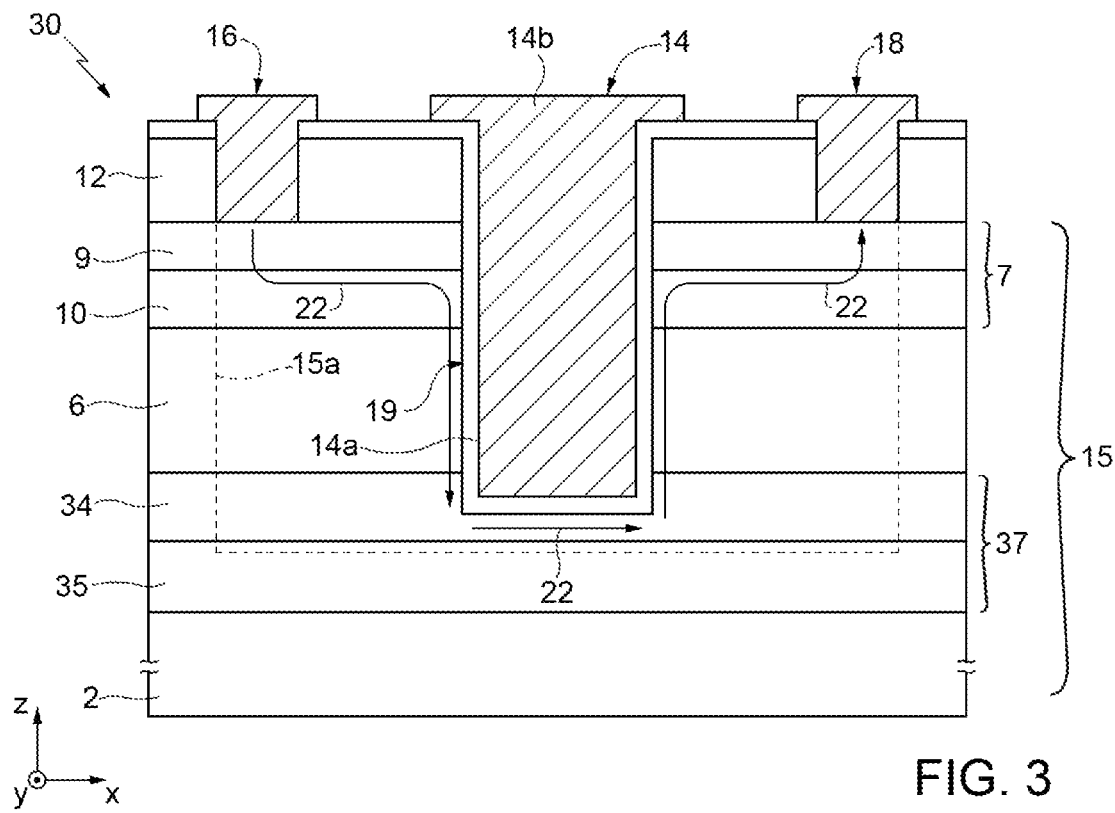
FIG. 3 shows, in lateral section, a HEMT according to a further embodiment of the present disclosure.

FIG. 3 shows a HEMT 30 according to a further embodiment of the present disclosure.

The HEMT 30 is similar to the HEMT 1 of FIG. 1 (elements that are in common are not described any further and are designated by the same reference numbers). However, in this case, the electrical-conduction layer 4 of GaN, represented in FIG. 1, is replaced by an electrical-conduction layer 34 of a compound of gallium nitride comprising aluminum, such as AlGaN. In addition, extending between the electrical-conduction layer 4, which is made, for example, of AlGaN, and the substrate 2, is a gallium-nitride layer 35 for forming a further heterojunction, or heterostructure, 37 underneath the gate region 14.

This solution is advantageous in so far as, in addition to the aforementioned advantages, the presence of the further heterostructure 37 underneath the gate region 14 enables formation of a layer of two-dimensional electron gas (2DEG) that reduces further the value of the ON-state resistance $R_{ON}$ of the HEMT device 30.

Figure 4:
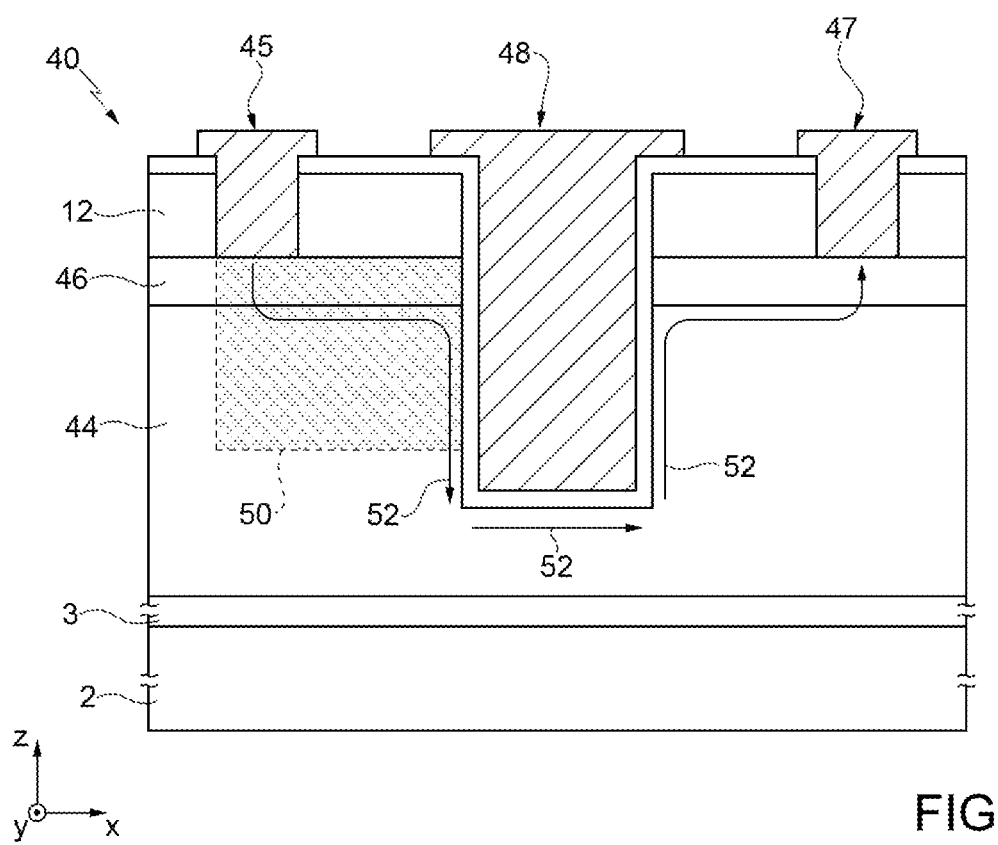
FIG. 4 shows, in lateral section, a HEMT according to a further embodiment of the present disclosure.

FIG. 4 shows a HEMT device 40 according to a further embodiment of the present disclosure.

The HEMT device 40 has, on the substrate 2 and on the buffer layer 3, a heterostructure formed by a channel layer 44 and a barrier layer 46. The channel layer 44 is, for example, of intrinsic gallium nitride (GaN), and the barrier layer 46 is, for example, of intrinsic aluminum gallium nitride (AlGaN). A gate region 48 of a recessed type extends between the source region 45 and the drain region 47. The source region 45 and drain region 47 extend alongside the gate region 48, on the barrier layer 46. Optionally, also the source region 45 and drain region 47 may be of a recessed type. The channel layer 44 and the barrier layer 46 are of materials such that, when they are coupled together as illustrated in the figure, they form a heterojunction that enables formation of a 2DEG layer.

The gate region 48 extends, along Z, through the barrier layer 46 and the channel layer 44, and terminates in the channel layer 44.

A resistive region 50, with P-type doping, extends alongside the gate region 48 and underneath the source region 45. The resistive region 50 may extend both in the barrier layer 46 and in the channel layer 44, or else exclusively in the channel layer 44.

It may be noted that the resistive region 50 extends at least in part in lateral contact with the gate region 48 and completely underneath the source region 45 in such a way that, in use, the conductive channel is formed necessarily through it in order to enable a flow of electric current (represented by arrows 52) between the source region 45 and the drain region 47. The resistive region 50 does not extend underneath the gate region 48.

Optionally, a further resistive region (not represented in the figure) may be present on the opposite side of the gate region 48, i.e., in lateral section, between the gate region 48 and the drain region 47 (in particular, specular to the resistive region 50).

The resistive region 50 (and the further resistive region, when present) has a density of dopant species comprised between $10^{15}$ cm$^{-3}$ and $10^{20}$ cm$^{-3}$, for example $10^{17}$ cm$^{-3}$.

Figure 5:
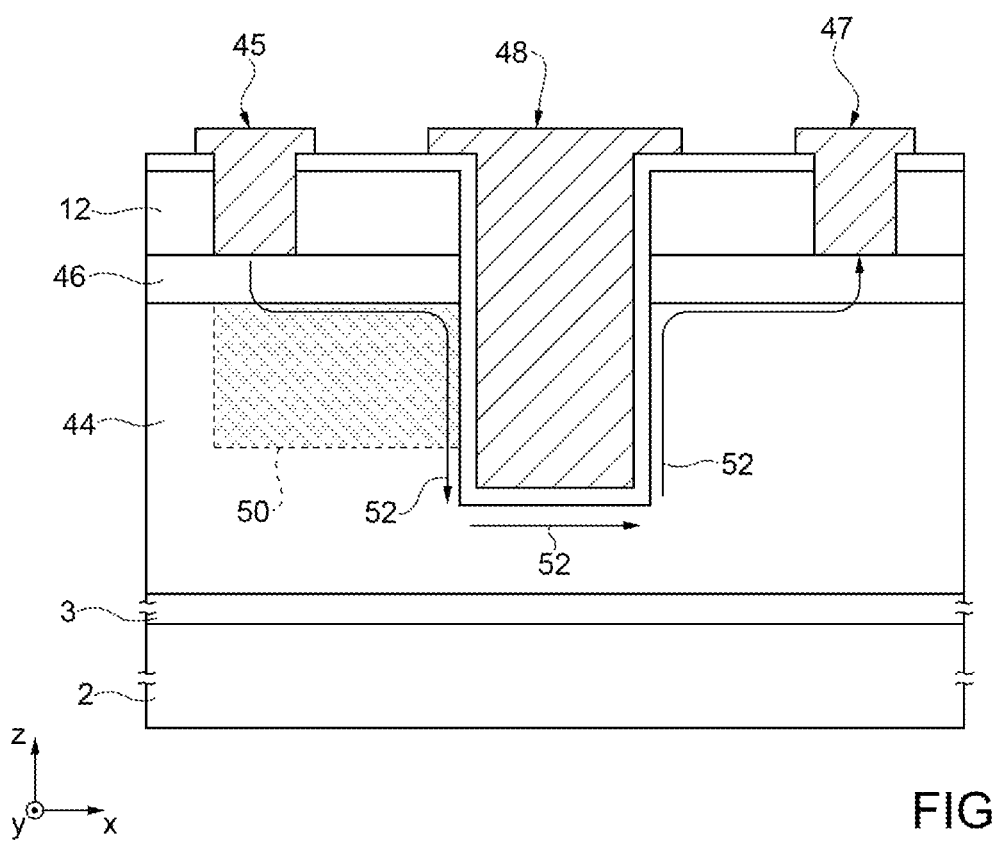
FIG. 5 shows, in lateral section, a HEMT according to a further embodiment of the present disclosure.

According to a variant of the embodiment of FIG. 4, the resistive region 50 extends (FIG. 5) exclusively in the channel layer 44 at least in part in lateral contact with the gate region 48 and completely underneath the source region 45 in such a way that, also in this case, the conductive channel is formed through the resistive region 50. A further resistive region (not shown) may be present on the opposite side of the gate region 48, specular to the resistive region 50.

Described in what follows, with reference to FIGS. 6A-6E, are steps for manufacturing the HEMT device 1 of FIG. 1.

Figure 6A:
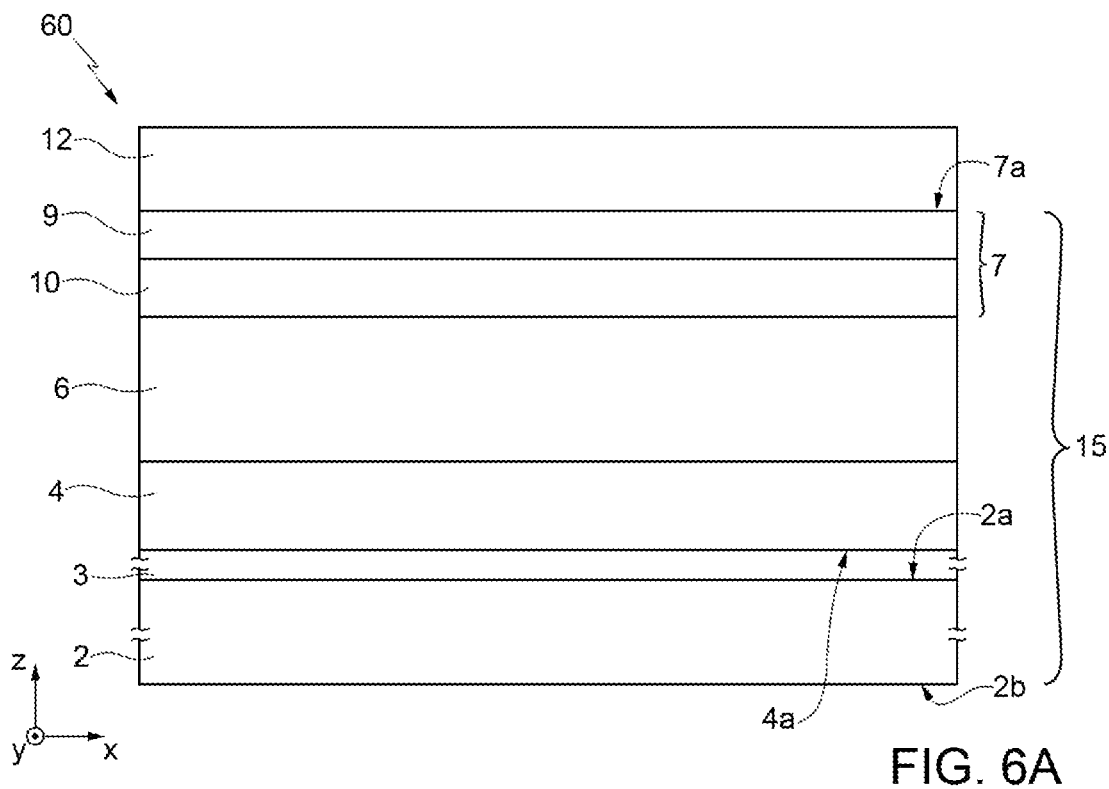
FIGS. 6A-6E show steps for manufacturing the HEMT of FIG. 1.

FIG. 6A shows, in cross-sectional view, a portion of a wafer 60 during a step of manufacture of the HEMT device 1, according to one embodiment of the present disclosure. Elements of the wafer 60 that are in common to the ones already described with reference to FIG. 1 and appearing in FIG. 1 are designated by the same reference numbers.

In particular (FIG. 6A), the wafer 60 is provided comprising: the substrate 2, made, for example, of silicon (Si) or silicon carbide (SiC) or aluminum oxide (Al$_2$O$_3$), having a front side 2a and a rear side 2b opposite to one another in a direction Z; the electrical-conduction layer 4, of intrinsic gallium nitride (GaN), having its own underside 4a that extends on the front side 2a of the substrate 2 (with the possible intermediate presence of the buffer layer 3); the resistive layer 6, of gallium nitride (GaN) with P-type doping; and the heterostructure 7, extending over the resistive layer 6.

By way of example, the resistive layer 6 has a thickness comprised between 5 nm and 1 μm, and the GaN layer 10 has a thickness comprised between a few nanometers (e.g., 2 nm) and 1 μm.

According to the present disclosure, extending on the front side 7a of the heterostructure 7 is the passivation layer, or insulation layer, 12, of dielectric or insulating material such as silicon nitride (SiN), silicon oxide (SiO$_2$), or some other material still. The insulation layer 12 has a thickness comprised between 5 nm and 300 nm, for example 100 nm, and is formed by chemical-vapor deposition (CVD) or atomic-layer deposition (ALD).

The wafer 60 according to FIG. 6A may be purchased prefabricated or else formed by processing steps in themselves known.

Next (FIG. 6B), the insulation layer 12 is selectively removed, for example with lithographic and etching steps, for removing selective portions thereof in the region of the wafer 60 where, in subsequent steps, a gate region of the HEMT device is to be formed (i.e., in an area corresponding to a part of the active area 15a).

Figure 6B:
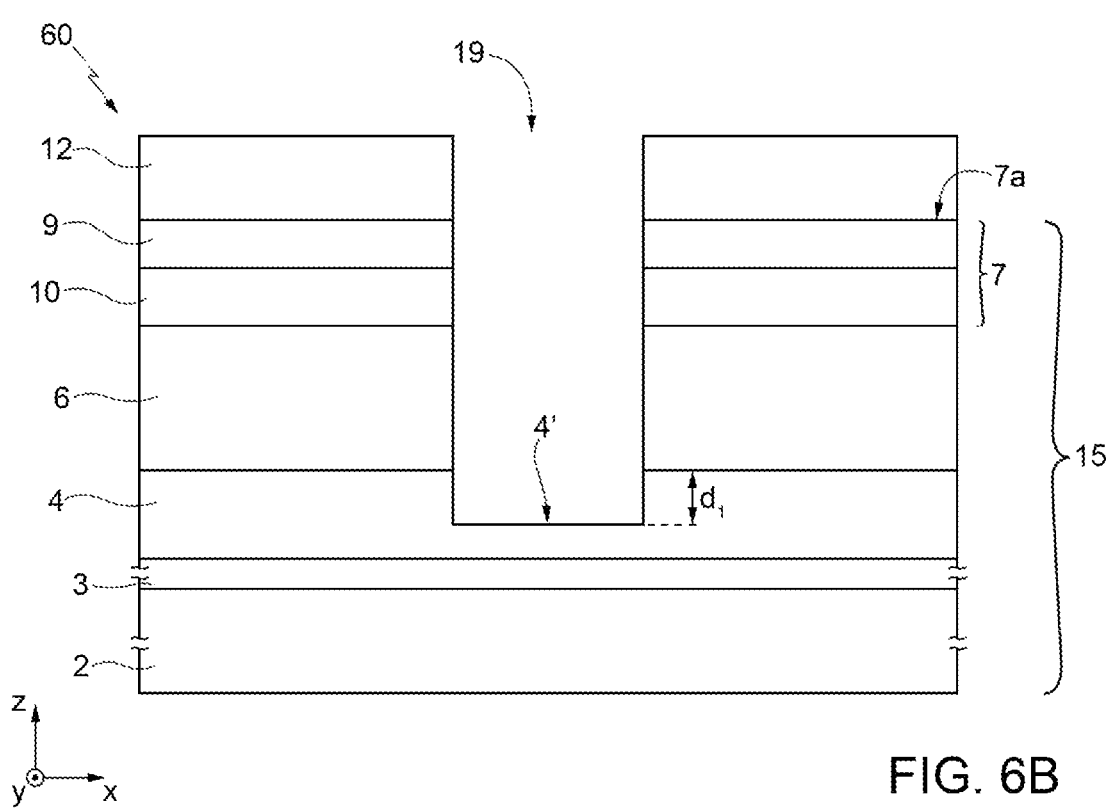
Figure 6C:
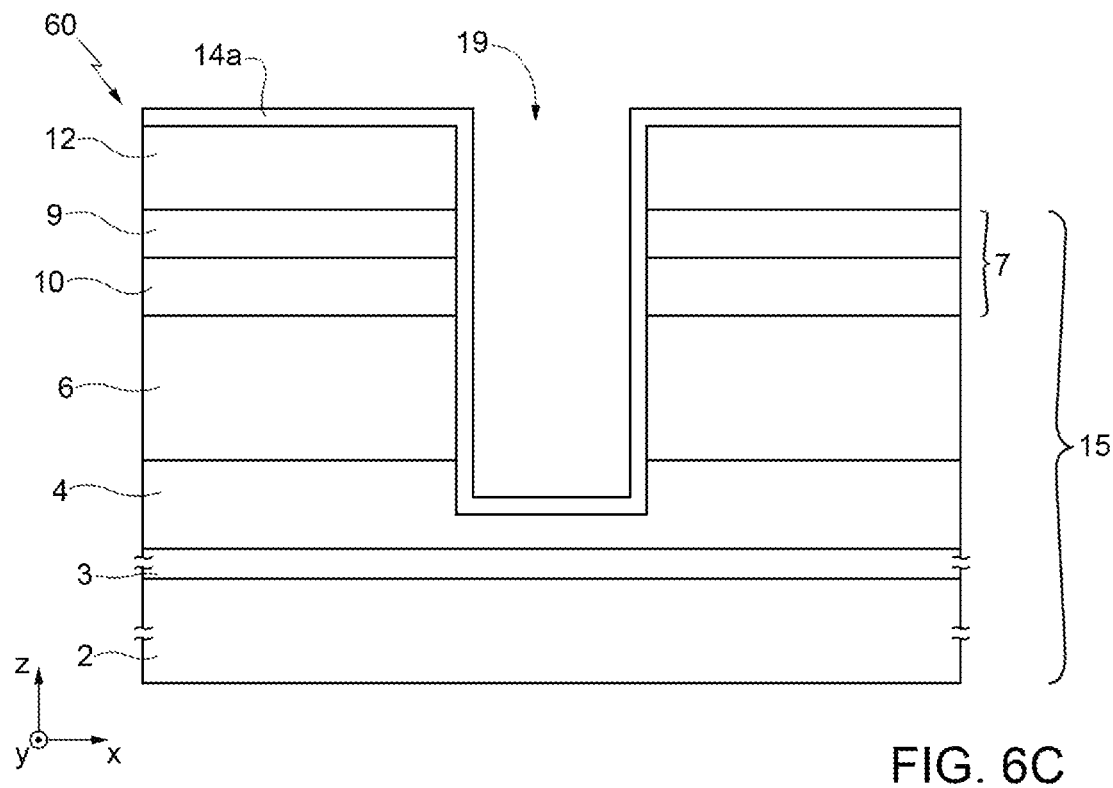
Figure 6D:
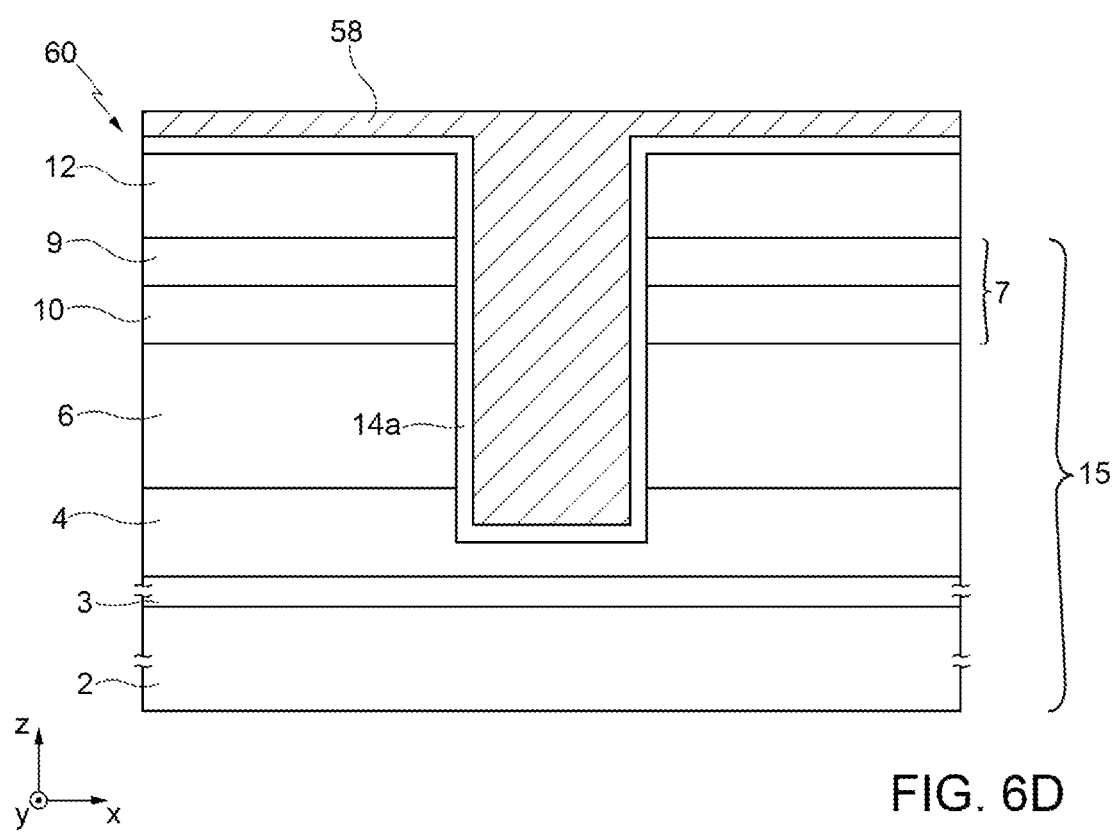
Figure 6E:
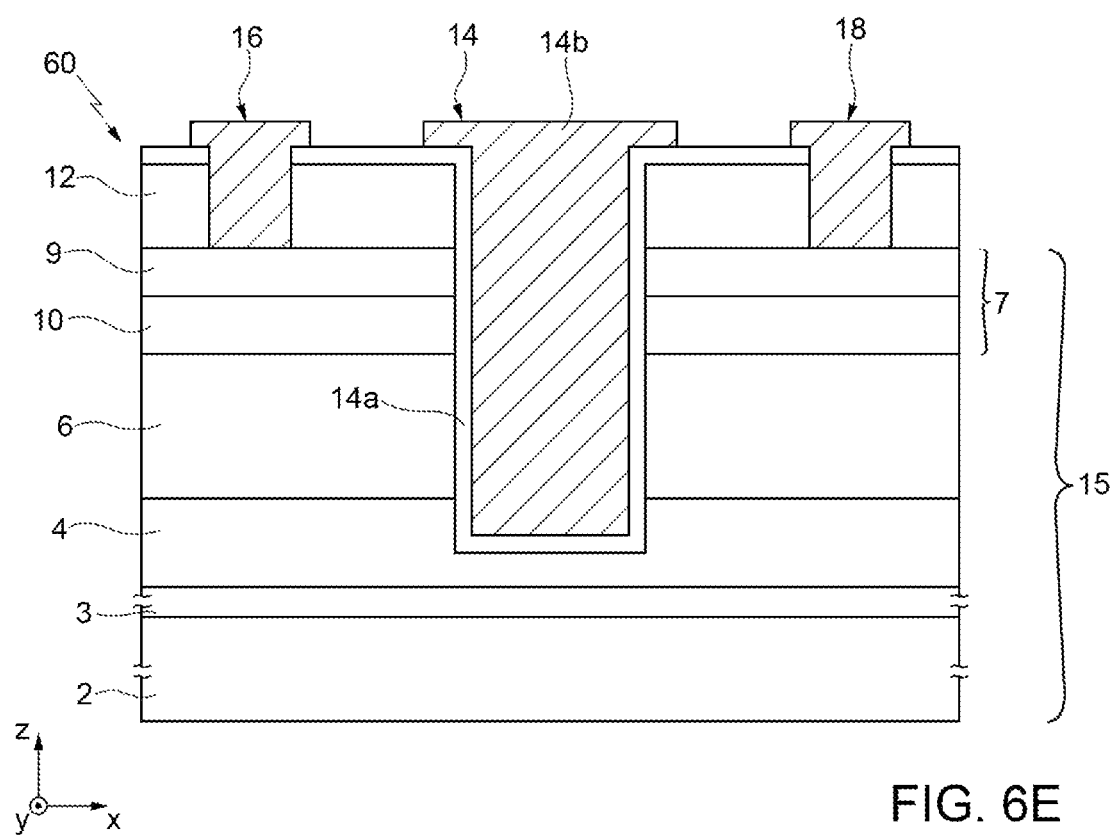

The etching step may stop at the electrical-conduction layer 4 (in a way not represented in the figure), or else proceed partially into the electrical-conduction layer 4 (the latter solution is represented in FIG. 6B). In either case, a surface portion 4' of the electrical-conduction layer 4 is exposed. The portion of the electrical-conduction layer 4 removed generates a cavity, in the electrical-conduction layer 4, having a depth di along Z comprised between 0 and 1 μm. However, other embodiments are possible, and the portion of the electrical-conduction layer 4 removed may have a depth, along Z, greater than 1 μm (in any case less than the total thickness of the electrical-conduction layer 4).

Then (FIG. 6C), a step is carried out of deposition, or growth, of the gate-dielectric layer 14a, for example of a material chosen from among aluminum nitride (AlN), silicon nitride (SiN), aluminum oxide (Al$_2$O$_3$), and silicon oxide (SiO$_2$). The gate-dielectric layer 14a has a thickness chosen between 5 nm and 50 nm, for example, 20 nm.

Next (FIG. 6D), a step is carried out of deposition of conductive material on the wafer 60 to form a conductive layer 58 on the gate-dielectric layer 14a, in particular filling the trench 19 completely. For example, the conductive layer 58 is of metal material, such as tantalum (Ta), tantalum nitride (TaN), titanium nitride (TiN), palladium (Pa), tungsten (W), tungsten silicide (WSi$_2$), titanium aluminum (Ti/Al), and nickel gold (Ni/Au).

The conductive layer 58 is then selectively removed with lithographic and etching steps in themselves known for eliminating the conductive layer 58 from the wafer 60 except for the portion thereof that extends in the trench 19 to form the gate metallization 14b. The gate metallization 14b and the gate dielectric 14a form, as a whole, the recessed-gate region 14 of the HEMT device 1 of FIG. 1.

Then (FIG. 6E), one or more further steps are carried out of masked etching of the dielectric layer 14a and of the insulation layer 12, to remove selective portions thereof that extend in regions of the wafer 60 where the source and drain regions 16, 18 of the HEMT device 1 are to be formed.

In particular, openings 54a and 54b are formed on opposite sides, along X, of the gate region 14, and at a distance from the gate region 14.

Next, a step of formation of ohmic contacts is carried out to provide the source and drain regions 16, 18, depositing conductive material, in particular metal such as titanium (Ti) or aluminum (Al), or their alloys or compounds, by sputtering or evaporation, on the wafer 60 and in particular inside the openings 54a, 54b. There is then carried out a subsequent step of etching of the metal layer thus deposited to remove said metal layer from the wafer 60 except for the metal portions that extend within the openings 54a and 54b, to form in said openings 54a and 54b the source region 16 and the drain region 18, respectively.

Then, a step of rapid thermal annealing (RTA), for example at a temperature between approximately 500° C. and 900° C. for a time ranging from 20 s to 5 min, enables formation of ohmic contacts of the source region 16 and drain region 18 with the underlying heterostructure 7.

The HEMT device 1 represented in FIG. 1 is thus formed.

With reference to the embodiment of FIG. 3, the manufacturing steps are similar to the ones described with reference to FIGS. 6A-6E, with the difference that, as an alternative to the electrical-conduction layer 4, of GaN, the layers 35 and 34, made, respectively, of GaN and AlGaN, are formed, stacked on top to one another.

With reference to the embodiment of FIG. 4, in this case, after providing a wafer comprising the substrate 2, the channel layer 44, and the barrier layer 46, prior to formation of the gate region 48, source region 45, and drain region 47, a step of implantation of dopant species, for example Mg, Zn, F, is carried out using as parameters an implantation energy of 30 keV and an implantation dose of $10^{15}$ cm$^{-2}$. The insulation layer 12 may be present during implantation in order to limit surface damage of the wafer. A step of thermal annealing enables activation of the implanted dopant species to form the resistive region 50 of FIG. 4.

By modulating the implantation energy, it is possible to modulate the implantation depth. For example, by increasing the implantation energy it is possible to form the resistive region 50 exclusively in the channel layer 44, at the desired depth. Use of an implantation step enables, in particular, definition of the resistive region only in the low-field region of the device.

The implantation steps are carried out using an appropriate mask in order to define the extension, in the plane XY, of the resistive implanted region.

The advantages of the disclosure according to the present disclosure emerge clearly from what has been set forth previously.

In particular, a considerable improvement of the trade-off between turn-on threshold voltage ($V_{th}$) and ON-state resistance ($R_{ON}$) is obtained.

Finally, it is clear that modifications and variations may be made to what has been described and illustrated herein, without thereby departing from the scope of the present disclosure.

For example, at the interface between the substrate 2 and the electrical-conduction layer 4 there may be present one or more further transition layers (not shown) of gallium nitride and compounds thereof, such as, for example, AlGaN, or AlN, having the function of interface for reducing the lattice misalignment between the substrate 2 and the electrical-conduction layer 4.

The metallization of the contacts (source, drain, gate) on the front of the wafer may be carried out using any variant known in the literature, such as, for example, formation of contacts of AlSiCu/Ti, Al/Ti, or W-plugs, or others still.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A normally-off electronic device, comprising:
a semiconductor body lying in a plane and including a buffer region and a first heterostructure extending over the buffer region;
a dielectric layer on the semiconductor body, the dielectric layer having a first surface;
a trench extending through the dielectric layer and at least partially through the buffer region;
a gate dielectric layer in the trench and on the first surface of the dielectric layer;
a recessed gate electrode in the trench, the recessed gate electrode extending in the semiconductor body at least partially through the buffer region, along a direction orthogonal to said plane;
a first working electrode and a second working electrode, which extend at respective sides of the gate electrode; and
an active area which extends in the buffer region alongside and underneath the gate electrode and is configured to house, in a first operating condition in which a first voltage between the gate electrode and the first working electrode is higher than a threshold voltage, a conductive path for a flow of an electric current between the first and second working electrodes, wherein:
said active area in the buffer region includes a resistive layer configured to hinder, in a second operating condition in which a second voltage between the gate electrode and the first working electrode is lower than the threshold voltage, an electric current flow between the first and second working electrodes,
the resistive layer is a layer of a compound formed by elements of Groups III-V with a doping of a P-type, extending underneath the first heterostructure,
said gate electrode extends in the semiconductor body to a depth, in said direction, equal to, or greater than, a maximum depth reached by the resistive layer, and
the dielectric layer is disposed directly underneath upper portions of the recessed gate electrode and the first and second working electrodes, the dielectric layer disposed between an upper surface of the semiconductor body and the upper portions of the recessed gate electrode and the first and second working electrodes.

2. The normally-off electronic device according to claim 1, wherein said heterostructure comprises a channel layer, of a material that is a compound formed by elements of Groups III-V including nitride, and an electron-supply layer extending over the channel layer.

3. The normally-off electronic device according to claim 1, wherein the active area includes a second heterostructure extending in the semiconductor body and below the resistive layer.

4. The normally-off electronic device according to claim 3, wherein the resistive layer has a density of dopant species comprised between $10^{15}$ ions/cm$^3$ and $10^{20}$ ions/cm$^3$.

5. The normally-off electronic device according to claim 3, wherein the gate electrode extends into the second heterostructure.

6. The normally-off electronic device according to claim 1, wherein:
the semiconductor body includes a semiconductor substrate;
the buffer region extends over the substrate and includes an electrical-conduction layer of a compound formed by elements of Groups III-V of an intrinsic type or with N-type doping;
said resistive layer extends on the electrical-conduction layer; and
said gate electrode extends in the semiconductor body at least to the electrical-conduction layer.

7. The normally-off electronic device according to claim 6, wherein:
the semiconductor body includes an interface layer of a compound formed by elements of Groups III-V and extending between the substrate and the electrical-conduction layer.

8. A high-electron-mobility transistor, comprising:
a semiconductor body including a buffer region and a first heterostructure extending over the buffer region;
a dielectric layer on the semiconductor body, the dielectric layer having a first surface;
a trench extending through the dielectric layer and at least partially through the buffer region;
a gate dielectric layer in the trench and on the first surface of the dielectric layer;
a gate recessed electrode in the trench, the gate recessed electrode extending in the semiconductor body at least partially through the buffer region; and
a first working electrode and a second working electrode, which extend at respective sides of the gate electrode,
wherein:
the buffer region is configured to house, in a first operating condition in which a first voltage between the gate electrode and the first working electrode is higher than a threshold voltage, a conductive path for a flow of an electric current between the first and second working electrodes,
the buffer region includes a resistive layer configured to hinder, in a second operating condition in which a second voltage between the gate electrode and the first working electrode is lower than the threshold voltage, an electric current flow between the first and second working electrodes,
the gate electrode extends in the semiconductor body to a depth equal to, or greater than, a maximum depth reached by the resistive layer, and
the dielectric layer is disposed directly underneath upper portions of the gate recessed electrode and the first and second working electrodes, the dielectric layer disposed between an upper surface of the semiconductor body and the upper portions of the gate recessed electrode and the first and second working electrodes.

9. The high-electron-mobility transistor according to claim 8, wherein said first heterostructure comprises a channel layer, of a material that is a compound formed by elements of Groups III-V including nitride, and an electron-supply layer extending over the channel layer.

10. The high-electron-mobility transistor according to claim 8, wherein the resistive layer has a density of dopant species comprised between $10^{15}$ ions/cm$^3$ and $10^{20}$ ions/cm$^3$.

11. The high-electron-mobility transistor according to claim 8, wherein the buffer region includes a second heterostructure extending in the semiconductor body and below the resistive layer.

12. The high-electron-mobility transistor according to claim 11, wherein the gate electrode extends into the second heterostructure.

13. The high-electron-mobility transistor according to claim 8, wherein:
the semiconductor body includes a semiconductor substrate;
the buffer region extends over the substrate and includes an electrical-conduction layer of a compound formed by elements of Groups III-V of an intrinsic type or with N-type doping;
the resistive layer extends on the electrical-conduction layer; and
the gate electrode extends in the semiconductor body at least to the electrical-conduction layer.

14. The high-electron-mobility transistor according to claim 13, wherein:
the semiconductor body includes an interface layer of a compound formed by elements of Groups III-V and extending between the substrate and the electrical-conduction layer.

15. A method for manufacturing a normally-off electronic device, comprising:
forming a dielectric layer on a semiconductor body, the semiconductor body extending in a plane and including a buffer region and a heterostructure extending over the buffer region, the dielectric layer having a first surface;
forming a trench extending through the dielectric layer and at least partially through the buffer region;
forming a gate dielectric layer in the trench and one the first surface of the dielectric layer;
forming a recessed gate electrode in the trench, the gate electrode extending at least partially through the buffer region, along a direction orthogonal to said plane;
forming a first working electrode and a second working electrode, the first working electrode and the second working electrode disposed at respective sides of the gate electrode, wherein the gate electrode, and the first and second working electrodes define an active area in the buffer region alongside and underneath the gate electrode, said active area being configured to house, in a first operating condition in which a first voltage between the gate electrode and the first working electrode is higher than a threshold voltage, a conductive path for a flow of electric current between the first and second working electrodes; and
forming a resistive region at least in part in the active area in said buffer region, said gate electrode extending in the semiconductor body as far as a depth, in said direction, equal to, or higher than, a maximum depth reached by the resistive region, the resistive region being configured to hinder, in a second operating condition in which a second voltage between the gate electrode and the first working electrode is lower than the threshold voltage, a flow of electric current between the first and second working electrodes,
wherein the dielectric layer is disposed directly underneath upper portions of the recessed gate electrode and the first and second working electrodes and the dielectric layer is disposed between an upper surface of the semiconductor body and the upper portions of the recessed gate electrode and the first and second working electrodes.

16. The method according to claim 15, wherein forming the heterostructure comprises forming a channel layer of a material that is a compound formed by elements of Groups III-V including nitride, and forming an electron-supply layer on the channel layer.

17. The method according to claim 15, wherein forming the resistive region includes implanting dopant species of a P-type between the gate electrode and at least one of the first working electrode and the second working electrode.

18. The method according to claim 17, wherein forming the resistive region includes depositing a layer of a compound formed by elements of Groups III-V with a doping of a P-type, underneath the heterostructure.

19. The method according to claim 15, wherein:
the semiconductor body includes a semiconductor substrate and the buffer layer includes an electrical-conduction layer of a compound formed by elements of Groups III-V of an intrinsic type or with N-type doping,
forming the resistive region includes forming the latter on the electrical-conduction layer and underneath the heterostructure, and
forming the gate electrode includes extending the gate electrode in the semiconductor body at least to the electrical-conduction layer.

20. The method according to claim 15, wherein:
the semiconductor body includes: a semiconductor substrate; and an interface layer of a compound formed by elements of Groups III-V that extends between the substrate and the buffer region, and
forming the gate electrode comprises extending the gate electrode in the semiconductor body at least to the interface layer.

* * * * *

UNITED STATES PATENT AND TRADEMARK OFFICE
CERTIFICATE OF CORRECTION

| | | |
|---|---|---|
| PATENT NO. | : 11,222,969 B2 | |
| APPLICATION NO. | : 16/808311 | |
| DATED | : January 11, 2022 | |
| INVENTOR(S) | : Ferdinando Iucolano et al. | |

It is certified that error appears in the above-identified patent and that said Letters Patent is hereby corrected as shown below:

In the Claims

<u>Column 10, Claim 15, Line 20:</u>
"and one the" should read: --and on the--.

Signed and Sealed this
Seventh Day of June, 2022

*Katherine Kelly Vidal*

Katherine Kelly Vidal
*Director of the United States Patent and Trademark Office*